(12) United States Patent
Darvishi et al.

(10) Patent No.: US 12,228,952 B2
(45) Date of Patent: Feb. 18, 2025

(54) ELECTRONIC DEVICES HAVING COMPLEMENTARY CURRENT MIRROR CIRCUITRY

(71) Applicant: Apple Inc., Cupertino, CA (US)

(72) Inventors: Milad Darvishi, San Diego, CA (US);
Georgios Palaskas, San Diego, CA (US)

(73) Assignee: Apple Inc., Cupertino, CA (US)

( * ) Notice: Subject to any disclaimer, the term of this patent is extended or adjusted under 35 U.S.C. 154(b) by 473 days.

(21) Appl. No.: 17/734,642

(22) Filed: May 2, 2022

(65) Prior Publication Data
US 2023/0350443 A1 Nov. 2, 2023

(51) Int. Cl.
*G05F 1/56* (2006.01)
*H03H 7/01* (2006.01)
*H04B 1/04* (2006.01)

(52) U.S. Cl.
CPC .............. *G05F 1/56* (2013.01); *H03H 7/0115* (2013.01); *H04B 1/04* (2013.01)

(58) Field of Classification Search
CPC ............ G05F 1/56; H03H 7/0115; H04B 1/04
USPC ........................................................ 455/120
See application file for complete search history.

(56) References Cited

U.S. PATENT DOCUMENTS

| | | | | |
|---|---|---|---|---|
| 6,415,181 B1* | 7/2002 | Schu | ...................... | A61N 1/372 607/16 |
| 6,608,787 B1* | 8/2003 | Daga | ...................... | G11C 7/067 365/205 |
| 7,116,953 B2 | 10/2006 | Kim et al. | | |
| 7,203,096 B2* | 4/2007 | Borromeo | ............... | G11C 16/26 365/208 |
| 7,251,178 B2* | 7/2007 | Gogl | ....................... | G11C 11/16 365/158 |
| 7,352,640 B2* | 4/2008 | Fort | ....................... | G11C 7/067 365/205 |
| 7,432,763 B2* | 10/2008 | Leete | ....................... | H03G 1/04 330/254 |
| 7,433,253 B2* | 10/2008 | Gogl | ................... | G11C 11/5678 365/158 |
| 7,605,643 B2* | 10/2009 | Kuriyama | ............... | G05F 3/262 327/540 |
| 7,636,264 B2* | 12/2009 | Fort | ....................... | G11C 7/067 365/189.11 |

(Continued)

OTHER PUBLICATIONS

Bram Nauta, a CMOS Transconductance-C Filter Technique for Very High Frequencies, IEEE Journal of Solid-State Circuits, Feb. 1992, pp. 142-153, vol. 27, No. 2., IEEE, New York, New York, United States.

*Primary Examiner* — April G Gonzales
(74) *Attorney, Agent, or Firm* — Treyz Law Group; Jason Tsai

(57) ABSTRACT

An electronic device may include wireless circuitry having digital-to-analog converters, filters, mixers, and current buffers disposed between the filters and the mixers. The current buffers may provide proper resistance termination for the filters. The current buffers may include current mirrors formed from diode-connected n-type transistors and diode-connected p-type transistors, which collectively provide a linear input resistance. The current mirrors may receive a high voltage from a voltage regulator having a replica current mirror and proportional-to-absolute-temperature current sources.

20 Claims, 12 Drawing Sheets

(56) References Cited

U.S. PATENT DOCUMENTS

| | | | | |
|---|---|---|---|---|
| 7,642,815 B2* | 1/2010 | Fort | ............... | G11C 7/067 327/51 |
| 7,663,440 B2 | 2/2010 | Komori et al. | | |
| 8,031,547 B2* | 10/2011 | Fort | ............... | G11C 7/065 365/207 |
| 8,165,553 B2 | 4/2012 | Lou et al. | | |
| 8,169,845 B2* | 5/2012 | Fort | ............... | G11C 7/067 365/189.11 |
| 8,189,402 B2* | 5/2012 | Lin | ............... | G11C 7/062 365/210.1 |
| 8,194,721 B2* | 6/2012 | Gray | ............... | H04L 1/243 375/221 |
| 8,258,817 B2* | 9/2012 | Fukuda | ............... | H01L 27/092 327/87 |
| 8,270,242 B2* | 9/2012 | Fort | ............... | G11C 7/067 365/207 |
| 8,378,747 B2* | 2/2013 | Aisu | ............... | H03F 3/45188 330/261 |
| 8,405,428 B2* | 3/2013 | Fukuda | ............... | H03K 17/04 327/87 |
| 8,476,931 B2* | 7/2013 | Matsuoka | ............... | H03K 19/00361 327/108 |
| 8,605,528 B2* | 12/2013 | Barth, Jr. | ............... | G11C 11/4091 365/207 |
| 8,615,205 B2 | 12/2013 | Choksi et al. | | |
| 8,854,098 B2 | 10/2014 | Yang et al. | | |
| 8,970,272 B2* | 3/2015 | Zhang | ............... | H03K 3/017 327/52 |
| 9,059,696 B1 | 6/2015 | Rahman | | |
| 9,154,077 B2* | 10/2015 | Chan | ............... | H03K 21/026 |
| 9,329,669 B2* | 5/2016 | Jeon | ............... | G06F 1/3287 |
| 9,692,415 B2* | 6/2017 | Okamoto | ............... | H03K 19/0013 |
| 9,755,678 B2* | 9/2017 | Selvanayagam | ............... | H03F 1/0205 |
| 9,960,768 B2* | 5/2018 | Lee | ............... | H03K 19/018507 |
| 9,977,480 B2* | 5/2018 | Kolla | ............... | G06F 1/3234 |
| 10,211,833 B2* | 2/2019 | Tang | ............... | H03K 19/0016 |
| 10,348,260 B2* | 7/2019 | Oishi | ............... | H03F 3/45475 |
| 10,684,671 B2* | 6/2020 | Sridhar | ............... | G06F 1/3296 |
| 10,895,887 B1* | 1/2021 | Aksin | ............... | G05F 3/265 |
| 10,911,045 B1* | 2/2021 | Ming | ............... | H03K 17/145 |
| 10,924,309 B2* | 2/2021 | Darwhekar | ............... | H04L 27/1525 |
| 11,082,021 B2* | 8/2021 | Lin | ............... | H03G 3/3042 |
| 11,239,800 B2* | 2/2022 | Drogi | ............... | H04B 1/40 |
| 11,482,975 B2* | 10/2022 | Lyalin | ............... | H03F 3/245 |
| 11,621,680 B2* | 4/2023 | Chan | ............... | H03F 1/56 330/195 |
| 11,637,533 B2* | 4/2023 | Nam | ............... | G09G 3/20 381/120 |
| 11,855,595 B2* | 12/2023 | Lyalin | ............... | H04B 1/38 |
| 2005/0068073 A1* | 3/2005 | Shi | ............... | H03L 7/107 327/156 |
| 2010/0176775 A1* | 7/2010 | Kuo | ............... | G05F 1/56 323/282 |
| 2011/0210798 A1* | 9/2011 | Koh | ............... | H03K 3/011 331/57 |
| 2011/0215875 A1* | 9/2011 | Yagishita | ............... | H03L 7/099 331/34 |
| 2011/0298556 A1* | 12/2011 | Lin | ............... | H03L 1/022 331/185 |
| 2012/0161734 A1* | 6/2012 | Wu | ............... | G05F 1/575 323/282 |
| 2013/0328707 A1* | 12/2013 | Choksi | ............... | H04L 5/1461 341/144 |
| 2014/0035550 A1* | 2/2014 | Chen | ............... | G05F 1/618 323/311 |
| 2019/0101946 A1* | 4/2019 | Herberholz | ............... | G05F 1/465 |
| 2020/0163562 A1* | 5/2020 | Neaves | ............... | A61B 5/00 |
| 2020/0244239 A1* | 7/2020 | Dufrene | ............... | H03F 3/72 |
| 2021/0303018 A1* | 9/2021 | Aksin | ............... | H03F 3/3076 |

* cited by examiner

ELECTRONIC DEVICES HAVING COMPLEMENTARY CURRENT MIRROR CIRCUITRY

FIELD

This disclosure relates generally to electronic devices and, more particularly, to electronic devices with wireless circuitry.

BACKGROUND

Electronic devices are often provided with wireless capabilities. An electronic device with wireless capabilities has wireless circuitry that includes one or more antennas. A transmitter in the wireless circuitry uses the antennas to transmit wireless signals.

Signals generated by the transmitter are fed through a data converter, filter circuits, and mixer circuits. A current buffer circuit is sometimes coupled between the filter circuits and the mixer circuits to help provide proper impedance termination for the filter circuits. If care is not taken, the current buffer circuit can exhibit poor linearity and can degrade the overall performance of the transmitter.

SUMMARY

An electronic device may include wireless circuitry. The wireless circuitry may include one or more processors configured to generate digital (baseband) signals that are fed through an in-phase (I) channel and a quadrature-phase (Q) channel. Each of the I and Q channels may include a digital-to-analog converter, a differential LC filter, a differential current buffer, and mixers coupled together in a chain. The differential current buffer may provide proper termination resistance for the differential LC filter. The differential current buffer may be implemented using complementary current mirror circuits. The complementary current mirror circuits may each include a diode-connected n-type transistor coupled in series with a diode-connected p-type transistor. Having both diode-connected n-type and p-type transistors in the input branch of a current mirror can help linearize the input resistance of the current buffer.

If desired, a resistor may be coupled between the gate and drain terminals of the n-type transistor in each current mirror to help decouple the input common mode voltage of the current buffer from the gate voltage of the n-type transistor. A capacitor may be coupled in parallel with that resistor to help mitigate any inductive behavior associated with the resistor. If desired, an envelope detector and a frequency-dependent current mirror may also be coupled to the current mirrors to further improve the linearity of the current buffer. The envelope detector may include n-type transistors configured to sense the input common mode voltage of the current buffer to generate a second order intermodulation (IM2) signal, and the frequency-dependent current mirror may be configured to amplify the IM2 signal in a given frequency range and to output a corresponding amplified IM2 signal to reduce any second order intermodulation distortion (IMD2) and/or any third order intermodulation distortion (IMD3) on a supply voltage line of the current buffer.

The supply voltage line of the current buffer may be regulated using a voltage regulator such as a low dropout (LDO) voltage regulator. The voltage regulator may include a replica complementary current mirror having a diode-connected n-type transistor coupled in series with a diode-connected p-type transistor and having temperature-dependent current sources to help provide temperature insensitive voltage regulation.

An aspect of the disclosure provides wireless circuitry that includes a digital-to-analog converter having an output, a filter having an input coupled to the output of the digital-to-analog converter and having an output, mixer circuitry having inputs, and a current buffer disposed between the output of the filter and the inputs of the mixer circuitry. The current buffer can include: a first n-type transistor having a source terminal coupled to a ground power supply line, a gate terminal, and a drain terminal coupled to its gate terminal; a first p-type transistor having a source terminal coupled to a voltage line, a gate terminal, and a drain terminal coupled to its gate terminal and coupled to the drain terminal of the first n-type transistor; a second n-type transistor having a source terminal coupled to the ground power supply line, a gate terminal shorted to the gate terminal of the first n-type transistor, and a drain terminal coupled to the mixer circuitry; and a second p-type transistor having a source terminal coupled to the voltage line, a gate terminal shorted to the gate terminal of the first p-type transistor, and a drain terminal coupled to the drain terminal of the second n-type transistor. The current buffer can include a replica current mirror, a first temperature-dependent current source coupled to the source terminal of the third p-type transistor, and a second temperature-dependent current source coupled to the drain terminal of the third p-type transistor. The current buffer can include a resistor having a first terminal coupled to the gate terminal of the first n-type transistor and having a second terminal coupled to the drain terminal of the first n-type transistor and can include a capacitor having a first terminal coupled to the first terminal of the resistor and having a second terminal coupled to the second terminal of the resistor. The current buffer can include an envelope detector configured to sense an input common mode voltage for the current buffer and to output a corresponding second order intermodulation signal and can include a frequency-dependent current mirror configured to amplify the second order intermodulation signal and to output the amplified second order intermodulation signal onto the voltage line. The filter can be a differential LC filter having inductors and adjustable capacitors.

An aspect of the disclosure provides wireless circuitry that includes a digital-to-analog converter having an output, a filter having an input coupled to the output of the digital-to-analog converter and having an output, mixer circuitry having inputs, and a current buffer disposed between the output of the filter and the inputs of the mixer circuitry. The current buffer can include a first inverter having an input coupled to the output of the filter and having an output, a second inverter having an input coupled to the input of the first inverter and having an output coupled to one of the inputs of the mixer circuitry, and a first resistor having a first terminal coupled to the input of the first inverter and having a second terminal coupled to the output of the first inverter. The current buffer can further include a third inverter having an input coupled to the output of the filter and having an output, a fourth inverter having an input coupled to the input of the third inverter and having an output coupled to another one of the inputs of the mixer circuitry, and a second resistor having a first terminal coupled to the input of the third inverter and having a second terminal coupled to the output of the third inverter. The first and second resistors set the differential input resistance for the current buffer. The first and third inverters can each have a first size, whereas the second and fourth inverters can each have a second size larger than the first size.

An aspect of the disclosure provides wireless circuitry that includes a first digital-to-analog converter configured to generate in-phase signals, a second digital-to-analog converter configured to generate quadrature-phase signals, a first LC filter configured to filter the in-phase signals and having first inductors and a first adjustable capacitor with a first capacitance value, a second LC filter configured to filter the quadrature-phase signals and having second inductors and a second adjustable capacitor with a second capacitance value different than the first capacitance value, a first current buffer configured to receive signals from the first LC filter, and a second current buffer configured to receive signals from the second LC filter. The different capacitance values of the first and second LC filters can help compensate for any input resistance mismatch between the current buffers and/or compensate other types of mismatch between the in-phase channel and the quadrature-phase channel.

DETAILED DESCRIPTION

Figure 1:
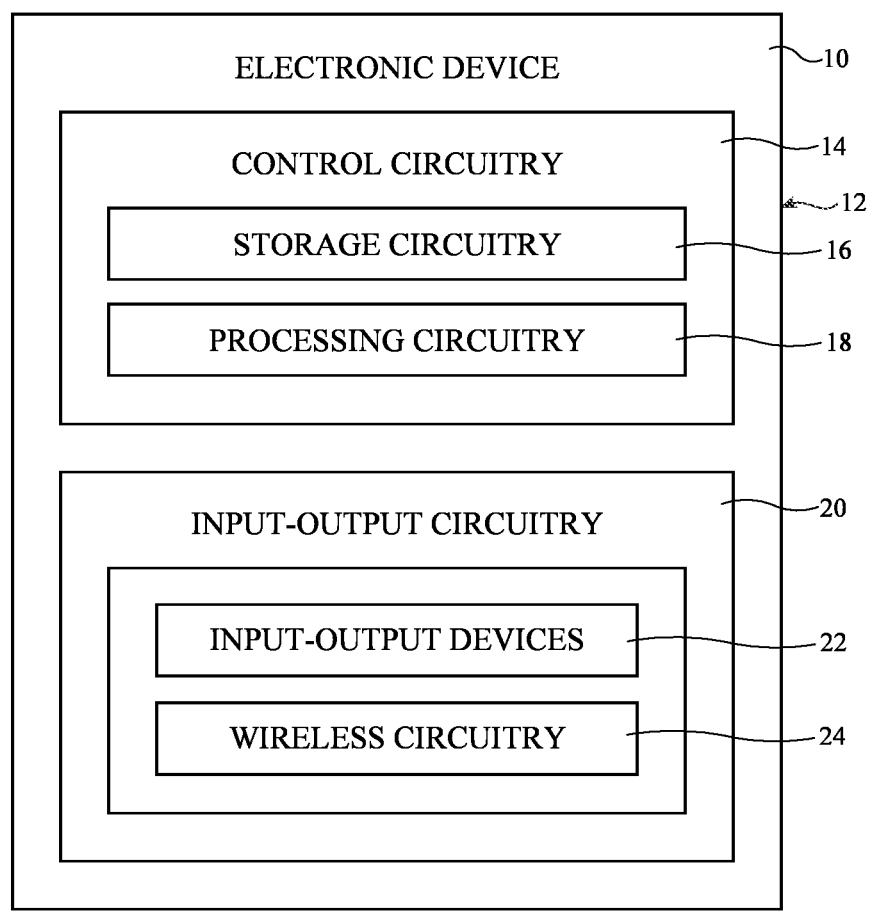
FIG. 1 is a functional block diagram of an illustrative electronic device having wireless circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802. XX family of standards, and/or any other desired frequency bands of interest.

Figure 2:
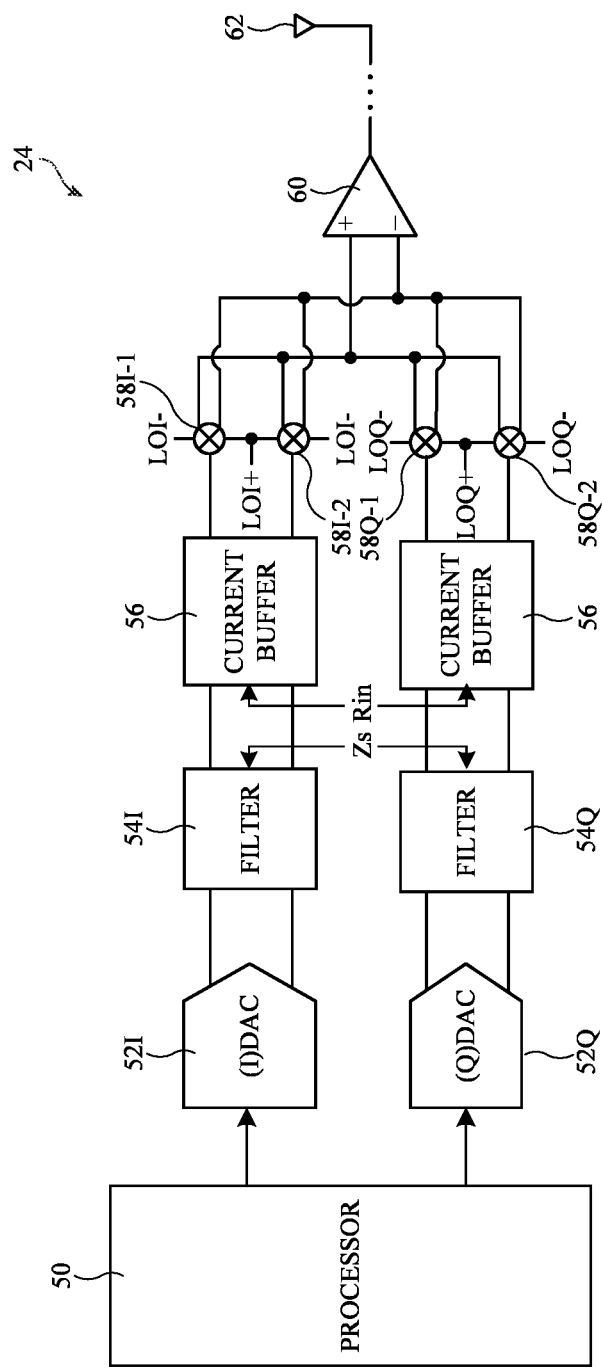
FIG. 2 is a circuit diagram of illustrative transmit circuitry having filters, current buffers, mixers, power amplifier, and an antenna in accordance with some embodiments.

Wireless circuitry 24 may include transmit circuitry for transmitting or radiating signals to external devices using the antenna(s). FIG. 2 is a circuit diagram of illustrative transmit circuitry (sometimes referred to as a transmit path) within wireless circuitry 24 in accordance with an embodiment. As shown in FIG. 2, the transmit circuitry may include a processor such as processor 50, data converting circuits such as digital-to-analog converters (DACs) 52I and 54Q, filtering circuits such as filters 54I and 54Q, current buffering circuits such as current buffers 56, mixing circuits such as mixers 58I-1, 58I-2, 58Q-1, and 58Q-2, an amplifying circuit such as amplifier 60, and one or more antennas 62.

Processor 50 may be a baseband processor, an application processor, a digital signal processor, a microcontroller, a microprocessor, a central processing unit (CPU), a programmable device, a combination of these circuits, and/or one or more processors within circuitry 18. Processor 50 may be configured to generated digital (transmit) signals. The digital signals generated by processor 50 may include in-phase (I) digital signals and quadrature-phase (Q) digital signals. The in-phase signals may be fed through a first group of circuits sometimes referred to collectively as the in-phase (I) channel, whereas the quadrature-phase signals may be fed through a second group of circuits sometimes referred to as the quadrature-phase (Q) channel. The in-phase channel may include the in-phase DAC circuit 52I, the in-phase filter 54I, the in-phase current buffer 56, and in-phase mixers 58I-1 and 58I-2. The quadrature-phase channel may include the quadrature-phase DAC circuit 52Q, the quadrature-phase filter 54Q, the quadrature-phase current buffer 56, and quadrature-phase mixers 58Q-1 and 58Q-2.

Data converter 52I may be configured to convert the in-phase (I) signals output from processor 50 from the digital domain to the analog domain to generate corresponding in-phase analog signals. Filter 54I may be a low-pass filter, bandpass filter, or high-pass filter configured to pass through only a portion of the in-phase analog signals (e.g., to pass through signals in a given range(s) of frequencies while rejecting or at least partially attenuating signals outside of the given frequency range) to generate corresponding in-phase filtered signals. In-phase current buffer 56 may be used to provide proper output impedance termination for filter 54I. In accordance with some embodiments, providing a proper termination resistance for filter 54I enables filter 54I to be implemented as an LC filter since LC filters typically have more stringent termination requirements. An LC filter is defined as a filter circuit having inductor (L) and capacitor (C) components. An LC filter coupled between data converter 52I and current buffer 56 can help provide enhanced bandwidth (e.g., a bandwidth of 1 GHz or more), which enables DAC oversampling rates as low as four, eight or less, 12 or less, 16 or less, 2-4, 2-8, or other suitable ranges. If desired, filter 54I may alternatively be implemented as an RC filter (i.e., a filter having resistor and capacitor components). In general, filter 54I can be implemented using any combination of passive and/or active components. Device configurations in which filter 54I is an LC-type filter may sometimes be described herein as an example.

In the example of FIG. 2, the circuits in the IQ channels are differential circuits (e.g., circuits having differential input ports and/or differential output ports). The in-phase current buffer 56 may have a first differential output port coupled to mixer 58I-1 and a second differential output port coupled to mixer 58I-2. Mixers 58I-1 and 58I-2 may also receive local oscillator signals LOI+ and LOI− and may be configured to upconvert (modulate) the in-phase signals to radio frequencies or intermediate frequencies for later upconversion to radio frequencies. These frequencies may be 5G NR FR1 or FR2 frequencies, for example. Local oscillator signals LOI+ and LOI− may be 180 degrees phased shifted (as an example) or offset by some other phase value with respect to each other.

Similarly, data converter 52Q may be configured to convert the quadrature-phase (Q) signals output from processor 50 from the digital domain to the analog domain to generate corresponding quadrature-phase analog signals. Filter 54Q may be a low-pass filter, bandpass filter, or high-pass filter configured to pass through only a portion of the quadrature-phase analog signals to generate corresponding quadrature-phase filtered signals. Quadrature-phase current buffer 56 may be used to provide proper output impedance termination for filter 54Q. As described above with respect to the in-phase channel, providing a proper termination resistance for filter 54Q enables filter 54Q to be implemented as an LC filter since LC filters typically have more stringent termination requirements. An LC filter coupled between data converter 52Q and quadrature-phase current buffer 56 can help minimize amplitude modulation to phase modulation (AMPM) distortion while providing enhanced bandwidth (e.g., a bandwidth of 1 GHz or more), which enables DAC oversampling rates as low as four, eight or less, 12 or less, 16 or less, 2-4, 2-8, or other suitable ranges. If desired, filter 54Q may alternatively be implemented as an RC filter or using any combination of passive and/or active components. Device configurations in which filter 54Q is an LC-type filter may sometimes be described herein as an example.

The quadrature-phase current buffer 56 may have a first differential output port coupled to mixer 58Q-1 and a second differential output port coupled to mixer 58Q-2. Mixers 58Q-1 and 58Q-2 may also receive local oscillator signals LOI+ and LOI− and may be configured to upconvert (modulate) the quadrature-phase signals to radio frequencies or intermediate frequencies for later up-conversion to radio frequencies (e.g., 5G NR FR1 or FR2 frequencies). Local oscillator signals LOI+ and LOI− may be 180 degrees phased shifted (as an example) or offset by some other phase value with respect to each other.

The mixers of the IQ channels may output the upconverted signals to amplifier 60. Amplifier 60 (sometimes referred to as a power amplifier, radio-frequency power amplifier, or transmit amplifier) may be configured to amplify the upconverted signals for transmission by one or more corresponding antennas 62 in the transmit path without changing the signal shape, format, or modulation. Amplifier 60 may, for example, be used to provide 10 dB of gain, 20 dB of gain, 10-20 dB of gain, less than 20 dB of gain, more than 20 dB of gain, or other suitable amounts of gain. If desired, additional circuit components (e.g., additional filters, multiplexing circuitry, switching circuitry, coupling circuitry, impedance matching circuitry, tuning circuitry, etc.) may be disposed between the mixers and amplifier 60 and/or between amplifier 60 and antenna 62.

Antenna 62 may be formed using any desired antenna structures. For example, antenna 62 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of the antennas over time.

The radio-frequency signals handled by antennas 62 may be used to convey wireless communications data between device 10 and external wireless communications equipment (e.g., one or more other devices such as device 10). Wireless communications data may be conveyed by wireless circuitry 24 bidirectionally or unidirectionally. The wireless communications data may, for example, include data that has been encoded into corresponding data packets such as wireless data associated with a telephone call, streaming media content, internet browsing, wireless data associated with software applications running on device 10, email messages, etc.

Figure 3:
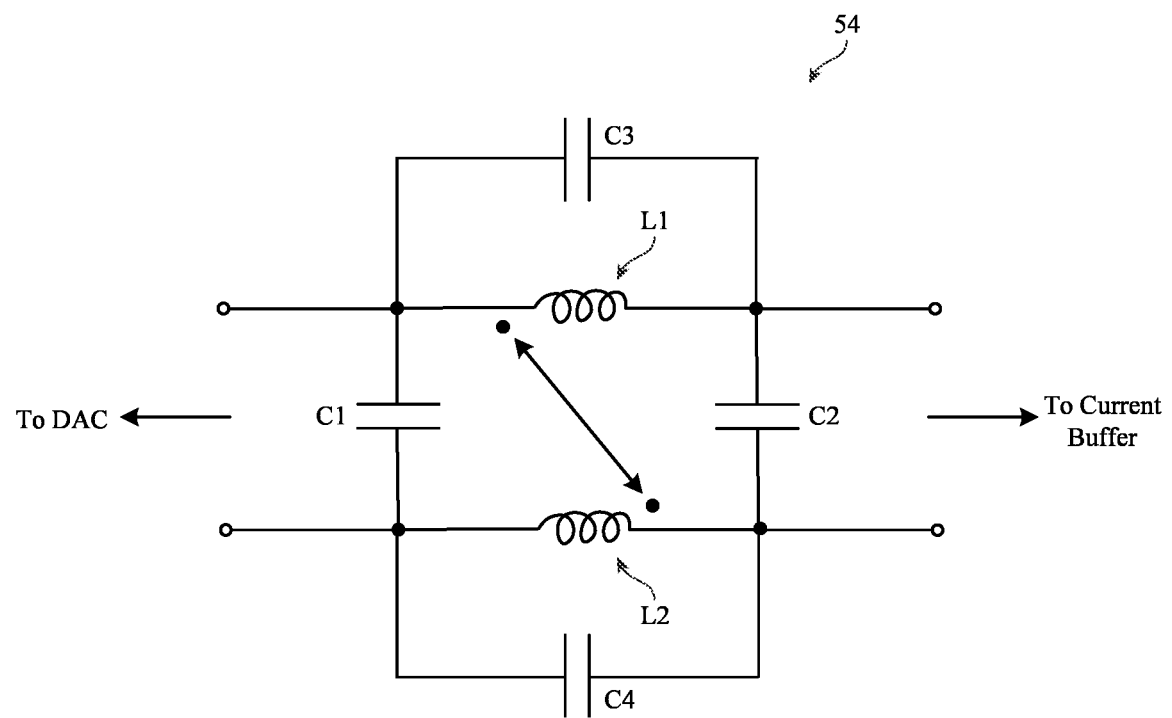
FIG. 3 is a circuit diagram of an illustrative differential LC filter circuit in accordance with some embodiments.

FIG. 3 is a circuit diagram of an illustrative filter circuit 54 in accordance with some embodiments. Filter 54 may represent one suitable implementation of the in-phase filter circuit 54I and the quadrature-phase filter circuit 54Q of FIG. 2. As shown in FIG. 3, filter 54 may be a differential LC filter circuit. Differential LC filter 54 may include inductors L1 and L2 and capacitors C1, C2, C3, and C4. Inductor L1 has a first (dotted) terminal coupled to a first differential input port of filter 54 and has a second terminal coupled to a first differential output port of filter 54. Inductor L2 has a first terminal coupled to a second differential input port of filter 54 and has a second (dotted) terminal coupled to a second differential output port of filter 54.

Capacitor C1 may be coupled across the two differential input ports of filter 54 and may sometimes be referred to as an input capacitor. The differential input ports of filter 54 may be configured to receive analog signals from a DAC circuit (e.g., DAC 52I or 52Q). Capacitor C2 may be coupled across the two differential output ports of filter 54 and may be defined as an output capacitor. The differential output ports of filter 54 may be coupled to a corresponding current buffer circuit (e.g., current buffer 56). Capacitor C3 has a first terminal coupled to the first differential input port of filter 54 and has a second terminal coupled to the first differential output port of filter 54 (e.g., capacitor C3 may be coupled in parallel with inductor L1).

Capacitor C4 has a first terminal coupled to the second differential input port of filter 54 and has a second terminal coupled to the second differential output port of filter 54 (e.g., capacitor C4 may be coupled in parallel with inductor L2). In some embodiments, capacitors C1, C2, C3, and/or C4 may have adjustable capacitance. If desired, filter 54 may include additional passive (e.g., inductive, capacitive, resistive) and/or active components (e.g., transistors).

As described above in connection with FIG. 2, current buffer 56 can help provide proper impedance termination for LC filter 54. In accordance with an embodiment, current buffer 56 may be implemented as a current mirror circuit (sometimes referred to as a current mirror). An ideal current mirror should exhibit perfect nonlinearity cancellation as the non-linear current of the output current branch would be canceled out by the non-linear current associated with the input current branch. In such scenario, the input resistance of the current mirror can be arbitrarily non-linear while the ratio of the output current to the input current remains perfectly linear.

Figure 4:
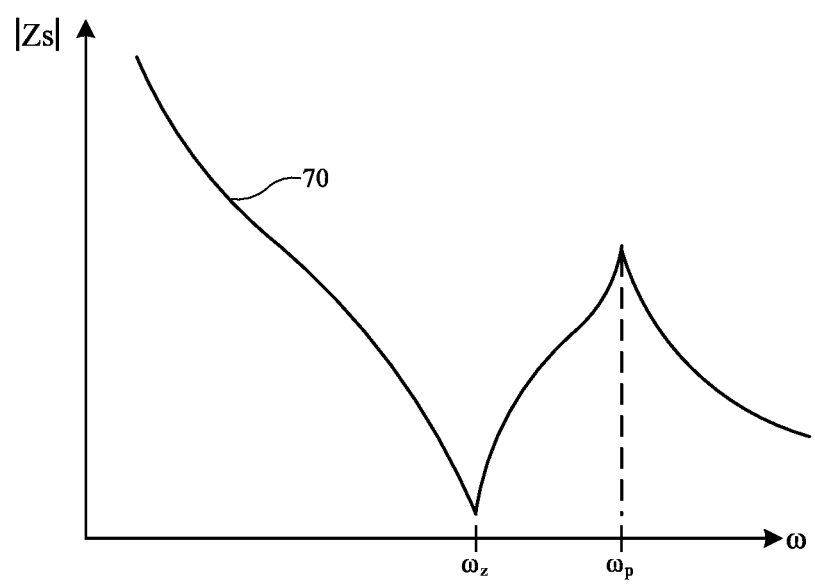
FIG. 4 is a diagram plotting the impedance seen by the current buffer looking towards the LC filter as a function of frequency in accordance with some embodiments.

In practice, however, this cancellation is disrupted if the current mirror sees a finite impedance at its input. In the example of FIG. 2, current buffer 56 (e.g., a current mirror circuit) may see a finite impedance Zs looking towards the LC filter and the digital-to-analog converter. FIG. 4 is a diagram plotting impedance Zs as a function of frequency. Curve 70 represents the magnitude of Zs. As shown in FIG. 4, curve 70 can have a zero at frequency $\omega_z$ (which causes the impedance to rise) and a pole at frequency $\omega_p$ (which causes impedance to fall), where $\omega_z$ is less than $\omega_p$. If care is not taken, the zero at $\omega_z$ can result in a noise overshoot and linearity degradation for current buffer 56 in or near the frequency band of interest. To mitigate this effect, it may be desirable to linearize the input resistance Rin of current buffer 56.

Figure 5:
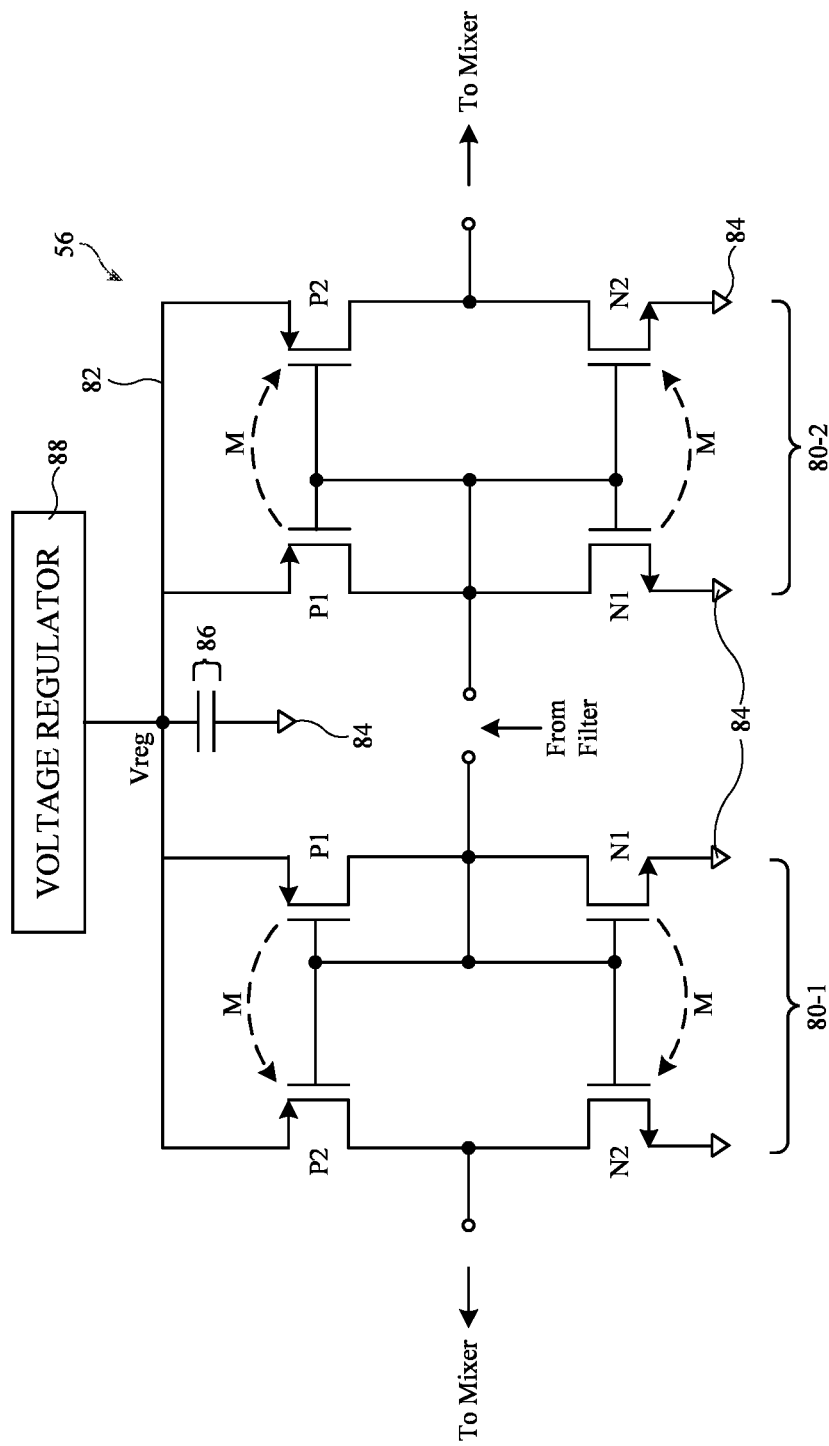
FIG. 5 is a circuit diagram of an illustrative current buffer implemented using differential current mirror circuits in accordance with some embodiments.

FIG. 5 is a circuit diagram of an illustrative current buffer 56 implemented using differential current mirror circuits. The current buffer 56 of FIG. 5 may represent current buffer 56 that is part of the in-phase channel and/or the quadrature-phase channel in FIG. 2. As shown in FIG. 5, current buffer 56 may include a first current mirror circuit 80-1 and a second current mirror circuit 80-2. Current buffer 56 having multiple current mirrors is therefore sometimes referred to as current mirror circuitry. Current mirror 80-1 may include n-type transistors N1 and N2 (e.g., n-channel metal-oxide-semiconductor or NMOS switches) and p-type transistors P1 and P2 (e.g., p-channel metal-oxide-semiconductor or PMOS switches).

Transistor N1 may have a source terminal coupled to a ground power supply line 84, a gate terminal, and a drain terminal that is shorted to its gate terminal and that is coupled to a first differential input port of current buffer 56. The first differential input port of current buffer 56 may be coupled to an LC filter (e.g., coupled to an output of filter 54 shown in FIG. 3). Ground power supply line 84 is sometimes referred to as a ground line or ground. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal). A transistor having its drain and gate terminals shorted is sometimes referred to as a diode-connected transistor. Transistor N1 is therefore a diode-connected n-type transistor within current mirror 80-1.

Transistor N2 may have a source terminal coupled to ground power supply line 84, a gate terminal coupled to the gate terminal of transistor N1, and a drain terminal coupled to a first differential output port of current buffer 56. The first differential output port of current buffer 56 may be coupled to a mixer (e.g., coupled to an input of one the mixers shown in FIG. 2). Transistor P2 may have a drain terminal coupled to the first differential output port of current buffer 56, a gate terminal, and a source terminal coupled to a high voltage line 82 (e.g., a voltage line on which a regulated voltage Vreg can be provided). Voltage line 82 may sometimes be referred to as the supply voltage line for current buffer 56. Transistor P1 may have a source terminal coupled to high voltage line 82, a gate terminal coupled to the gate terminal of transistor P2, and a drain terminal that is shorted to its gate terminal and that is coupled to the first different input port of current buffer 56. Transistor P1 is therefore a diode-connected p-type transistor within current mirror 80-1. Transistor P2 may be sized M times larger than transistor P1. Similarly, transistor N2 may be sized M times larger than transistor N1. Configured in this way, the current flowing through transistors P2 and N2 (sometimes referred to as the output current branch) may be M times larger than the current flowing through transistor P1 and N1 (sometimes referred to as the input current branch). The value M may be equal to 1, 2, 3, 4, 5, 1-10, 10-20, more than 20, or any suitable integer or number greater than one.

Similarly, current mirror 80-2 may also include n-type transistors N1 and N2 (e.g., re-channel metal-oxide-semiconductor or NMOS switches) and p-type transistors P1 and P2 (e.g., p-channel metal-oxide-semiconductor or PMOS switches). Transistor N1 in current mirror 80-2 may have a source terminal coupled to ground power supply line 84, a gate terminal, and a drain terminal that is shorted to its gate terminal and that is coupled to a second differential input port of current buffer 56. The second differential input port of current buffer 56 may be coupled to an LC filter (e.g., coupled to an output of filter 54 shown in FIG. 3). Transistor N1 is therefore a diode-connected n-type transistor within current mirror 80-2.

Transistor N2 in current mirror 80-2 may have a source terminal coupled to ground power supply line 84, a gate terminal coupled to the gate terminal of transistor N1, and a drain terminal coupled to a second differential output port of current buffer 56. The second differential output port of current buffer 56 may be coupled to a mixer (e.g., coupled to an input of another one the mixers shown in FIG. 2). Transistor P2 in current mirror 80-2 may have a drain terminal coupled to the second differential output port of current buffer 56, a gate terminal, and a source terminal coupled to voltage line 82. Transistor P1 in current mirror 80-2 may have a source terminal coupled to high voltage line 82, a gate terminal coupled to the gate terminal of transistor P2 in current mirror 80-2, and a drain terminal that is shorted to its gate terminal and that is coupled to the second different input port of current buffer 56. Transistor P1 is therefore a diode-connected p-type transistor within current mirror 80-2. Within current mirror 80-2, transistor P2 may be sized M times larger than transistor P1. Similarly, transistor N2 may be sized M times larger than transistor N1 within current mirror 80-2. Configured in this way, the current mirrored onto the output current branch can be M times that of the current in the input current branch.

Forming current mirrors using both diode-connected n-type and diode-connected p-type transistors in this way at the input of current buffer 56 can provide a mild push-pull behavior (e.g., to mimic a class AB amplifier behavior), which can help provide a more linear input resistance Rin and a more linear output current for buffer 56. A current mirror circuit having both diode-connected n-type transistor N1 and diode-connected p-type transistor P1 is sometimes referred to herein as a complementary current mirror. Any additional parasitic capacitance due to the complementary diode connection at the differential input port of current buffer 56 can be absorbed into the LC filter without adversely affecting the overall performance of the transmit path.

A capacitor 86 may be coupled to voltage line 82. Capacitor 86 may have a first terminal coupled to voltage line 82 and a second terminal coupled to ground line 84. A regulated voltage Vreg may be provided on voltage line 82 using, for example, a voltage regulating circuit such as voltage regulator 88. This is merely illustrative. If desired, a positive power supply voltage (e.g., voltage Vdd) greater than or less than the regulated voltage Vreg may be provided on high voltage line 82.

Figure 6:
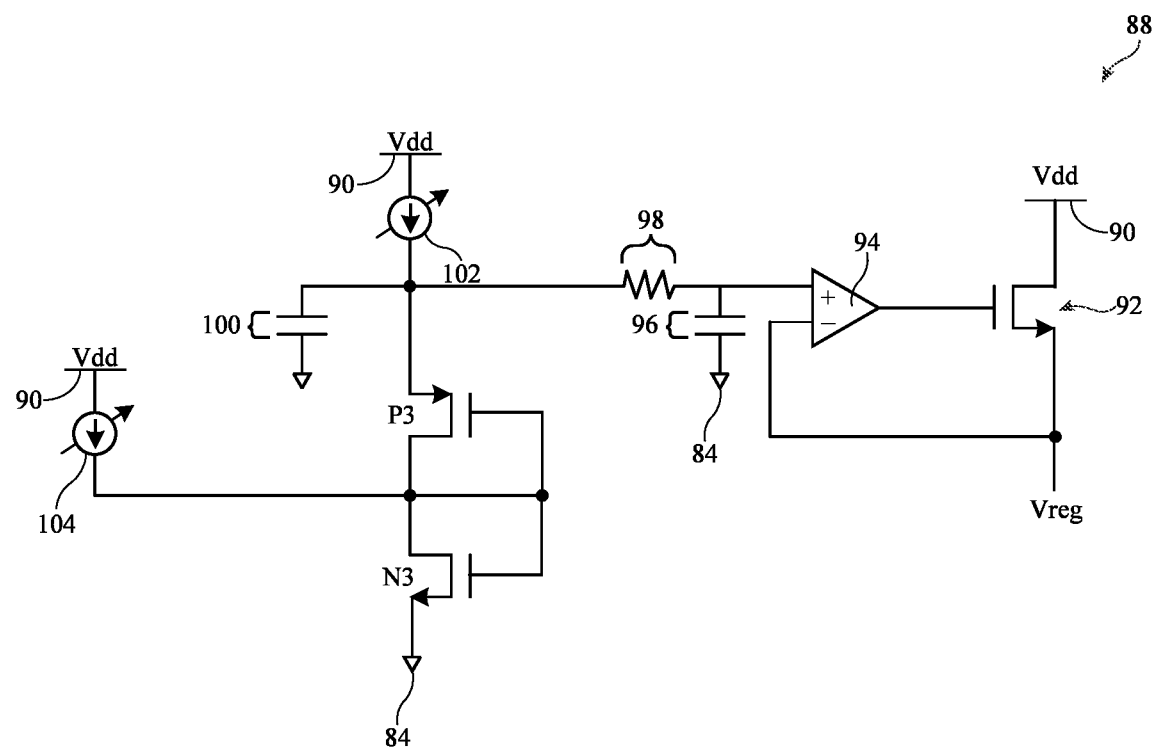
FIG. 6 is a circuit diagram of an illustrative voltage regulator having a replica current mirror in accordance with some embodiments.

FIG. 6 is a circuit diagram of an illustrative voltage regulator 88. As shown in FIG. 6, voltage regulator 88 may include an operational amplifier 94, a resistor 98, capacitors 96 and 100, current sources 102 and 104, and transistors 92, N3, and P3. Transistor 92 (e.g., an n-type transistor) may have a drain terminal coupled to a positive power supply line (e.g., a power supply line on which a positive power supply voltage Vdd is provided), a gate terminal, and a source terminal on which voltage Vreg is provided. Operational amplifier 94 may have an output terminal coupled to the gate of transistor 92, a first (positive) input terminal, and a second (negative) input terminal that is coupled to the source terminal of transistor 92. Capacitor 96 may have a first terminal coupled to the first (+) terminal of operational amplifier 94 and a second terminal coupled to ground line 84. Resistor 98 may have a first terminal coupled to the first (+) terminal of operational amplifier 94 and a second terminal. Capacitor 100 may have a first terminal coupled to the second terminal of resistor 98 and a second terminal coupled to the ground line.

Current source 102 may be coupled between positive power supply line 90 and the second terminal of resistor 98. Transistor P3 (e.g., a p-type transistor) may have a source terminal coupled to the second terminal of resistor 98, a gate terminal, and a drain terminal that is shorted to its gate terminal to form a diode-connected p-type transistor. Transistor N3 (e.g., an n-type transistor) may have a drain terminal coupled to the drain terminal of transistor P3, a source terminal coupled to ground line 84, and a gate terminal that is shorted to its gate terminal to form a diode-connected n-type transistor. Current source 104 may be coupled between positive power supply line 90 and the node disposed between transistors P3 and N3. Similar to transistors N1 and P1 in the current mirrors of buffer 56, transistors P3 and N3 within regulator 88 are also both in the diode-connected configuration and may therefore sometimes be referred to as "replica" biasing circuit. In one embodiment, transistors P3 and N3 may be smaller than transistors P1 and N1 (e.g., transistor P3 and N3 may be scaled down versions of transistors P1 and N1). In another embodiment, transistors P3 and N3 may be the same size as transistors P1 and N1. In yet another embodiment, transistors P3 and N3 may be larger than transistors P1 and 1 (e.g., transistor P3 and N3 may be sized up versions of transistors P1 and N1).

Configured in this way, voltage regulator 88 can exhibit a low impedance at its output, where a stable voltage Vreg can be provided. Current sources 102 and 104 can be proportional-to-absolute-temperature (PTAT) current sources, complementary-to-absolute-temperature (CTAT) current sources, or a combination of PTAT and CTAT current sources, which can be used within voltage regulator 88 to ensure that voltage Vreg is insensitive to temperature changes. PTAT and CTAT current sources are sometimes referred to herein as temperature-dependent current sources. Voltage regulator 88 of the type shown in FIG. 6 is sometimes referred to as a low dropout (LDO) voltage regulator. This is merely illustrative. If desired, other types of voltage regulators or supply regulating circuit can be coupled to current buffer 56. The use of voltage regulator 88 of FIG. 6 can help ensure that current buffer input resistance Rin is kept constant across process, voltage, temperature, and frequency (PVTF) variations and for a wide range of the full scale current of the corresponding DAC (e.g., DAC 52I or 52Q).

Current buffer 56 of the type shown in FIG. 5 may have a certain input common voltage Vcm_in. In practice, the associated DAC circuit coupled to the input port of current buffer 56 via the LC filter can only tolerate a certain range of the current buffer input common mode voltage Vcm_in. The input common mode voltage Vcm_in of current buffer 56 of FIG. 5 may be equal to the gate-to-source voltage across transistor N1. The gate-to-source voltage across transistor N1 is set by the input resistance Rin and the linearity of current buffer 56. Such relationship between the input common mode voltage Vcm_in and the input resistance Rin of current buffer 56 can make it difficult to design the DAC, filter, and/or the current buffer in the transmit path.

Figure 7:
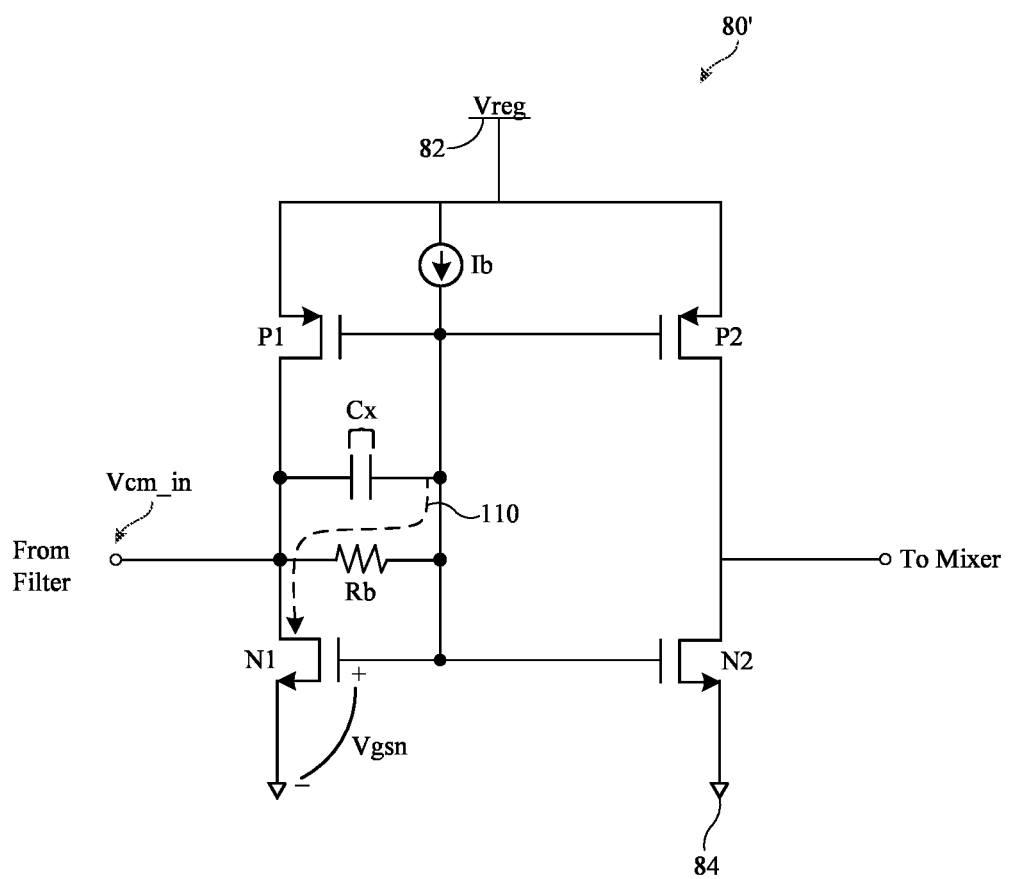
FIG. 7 is a circuit diagram of an illustrative current mirror circuit having input common mode voltage decoupling components in accordance with some embodiments.

FIG. 7 illustrates another example of a current mirror 80' that can be used within current buffer 56. For example, current mirrors 80-1 and 80-2 of FIG. 5 can be implemented using current mirror 80' of the type shown in FIG. 7. As shown in FIG. 7, current mirror 80' may include n-type transistors N1 and N2, p-type transistors P1 and P2, a current source Ib, a resistor Rb, and a capacitor Cx. Transistor N1 may have a source terminal coupled to ground power supply line 84, a gate terminal, and a drain terminal that is coupled to its gate terminal via resistor Rb and that is coupled to a differential input port of current buffer 56. Transistor N2 may have a source terminal coupled to ground power supply line 84, a gate terminal coupled to the gate terminal of transistor N1, and a drain terminal coupled to a differential output port of current buffer 56. Transistor P2 may have a drain terminal coupled to the differential output port of current buffer 56, a gate terminal, and a source terminal coupled to high voltage line 82 (sometimes referred to as a regulated voltage line). Transistor P1 may have a source terminal coupled to voltage line 82, a gate terminal coupled to the gate terminal of transistor P2, and a drain terminal that is coupled to its gate terminal via capacitor Cx and that is coupled to the different input port of current buffer 56. As an example, transistor P2 may be sized M times larger than transistor P1. Similarly, transistor N2 may be sized M times larger than transistor N1. The value M may be equal to 1, 2, 3, 4, 5, 1-10, 10-20, more than 20, or any suitable integer or number greater than one. Current source Ib may be coupled between voltage line 82 and the gate terminals of transistors P1 and P2 so that current Ib flows down through resistor Rb as indicated by current path 110.

The use of resistor Rb disposed between the drain and gate terminals of transistor N1 can decouple input common mode voltage Vcm_in from the gate-to-source voltage Vgsn of transistor N1. Configured as such, the current mirror input common mode voltage Vcm_in will be equal to the difference between transistor N1's gate-to-source voltage Vgsn and the voltage drop across resistor Rb (i.e., Vcm_in=Vgsn−Ib*Rb). Decoupling Vcm_in from Vgsn in this way can help make it easier to design the DAC, filter, and/or the current buffer in the transmit path. The addition of resistor Rb might lead to an inductive behavior in the input impedance of current mirror 80'. The use of capacitor Cx, which is coupled in parallel with resistor Rb, can help mitigate or cancel out this inductive behavior. Canceling out this inductive component can help ensure that there is minimal lag between the drain and gate terminals of transistor N1. Capacitor Cx should be sized much larger than the parasitic capacitance associated with resistor Rb (e.g., capacitor Cx may be at least 10 times, 10-100 times, more than 100 times, or more than 1000 times larger than the parasitic capacitance of resistor Rb).

The linearity of current buffer 56 can be adversely affected by intermodulation distortion terms that are sometimes present on voltage line 82. Intermodulation distortion arises when at least two signals of different frequencies are applied to a non-linear circuit and when the amplitude modulation or mixing (multiplication) of the two signals when their sum is raised to a power greater than one generates intermodulation products that are not just at harmonic frequencies (integer multiples) of either input signal but also at the sum and differences of the input signal frequencies and also at sums and differences of multiples of those frequencies.

Figure 8:
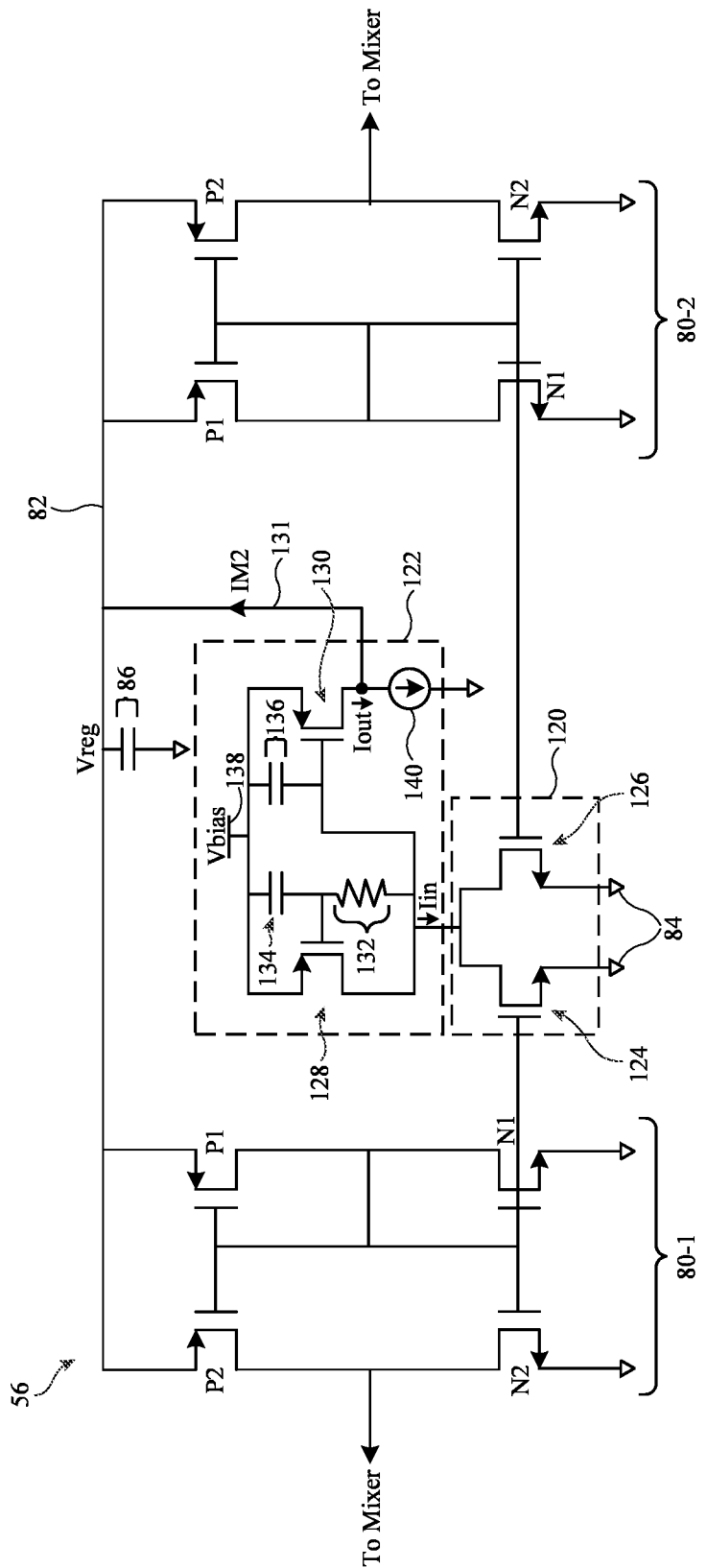
FIG. 8 is a circuit diagram of an illustrative current buffer having complementary current mirrors coupled to an additional frequency dependent current mirror in accordance with some embodiments.

The embodiment of FIG. 8 illustrates using an envelope detector and a frequency-dependent current mirror to inject a second order intermodulation (IM2) term onto voltage line 82 to cancel or mitigate any unwanted 2nd order intermodulation distortion (IMD2), which can also help reduce any third order intermodulation distortion (IMD3). As shown in FIG. 8, current buffer 56 may include current mirror 80-1, current mirror 80-2, envelope detector 120, and frequency-dependent current mirror 122. The structure and operation of current mirrors 80-1 and 80-2 shown in FIG. 8 are identical to that already described above in connection with FIG. 5 and need not be reiterated in detail in order to avoid obscuring the current embodiment. If desired, current mirrors 80-1 and 80-2 may alternatively be implemented using current mirror 80' of FIG. 7.

Envelope detector may include transistors 124 and 126 (e.g., n-type transistors). Transistor 124 may have a source terminal coupled to ground line 84, a gate terminal shorted to the gate terminal of transistor N1 in current mirror 80-1, and a drain terminal. Transistor 126 may have a source terminal coupled to ground line 84, a gate terminal shorted to the gate terminal of transistor N1 in current mirror 80-2, and a drain terminal coupled to the drain terminal of transistor 124. Configured in this way, envelope detector 120 can be used to sense the input common mode voltage of the two current mirrors and can generate an IM2 signal (sometimes referred to as an IM2 term or IM2 component).

Current mirror 122 may include a first p-type transistor 128, a second p-type transistor 130, a resistor 132, capacitors 134 and 136, and a current sink 140. Transistor 128 may have a drain terminal coupled to the drain terminals of transistors 124 and 126, a source terminal coupled to a bias voltage line 138 (e.g., a voltage line on which bias voltage Vbias is provided), and a gate terminal. Voltage Vbias can be less than Vreg, equal to Vreg, greater than Vreg, or equal to positive power supply voltage Vdd. Resistor 132 may be coupled across the gate and drain terminals of transistor 128. Capacitor 134 may be coupled across the gate and source terminals of transistor 128. Transistor 130 may have a source terminal coupled to bias voltage line 138, a gate terminal coupled to the drain terminal of transistor 128, and a drain terminal coupled to current sink 140. Capacitor 136 may be coupled across the gate and source terminals of transistor 130. The drain terminal of transistor 130 may also be coupled to high voltage line 82 via path 131.

Figure 9:
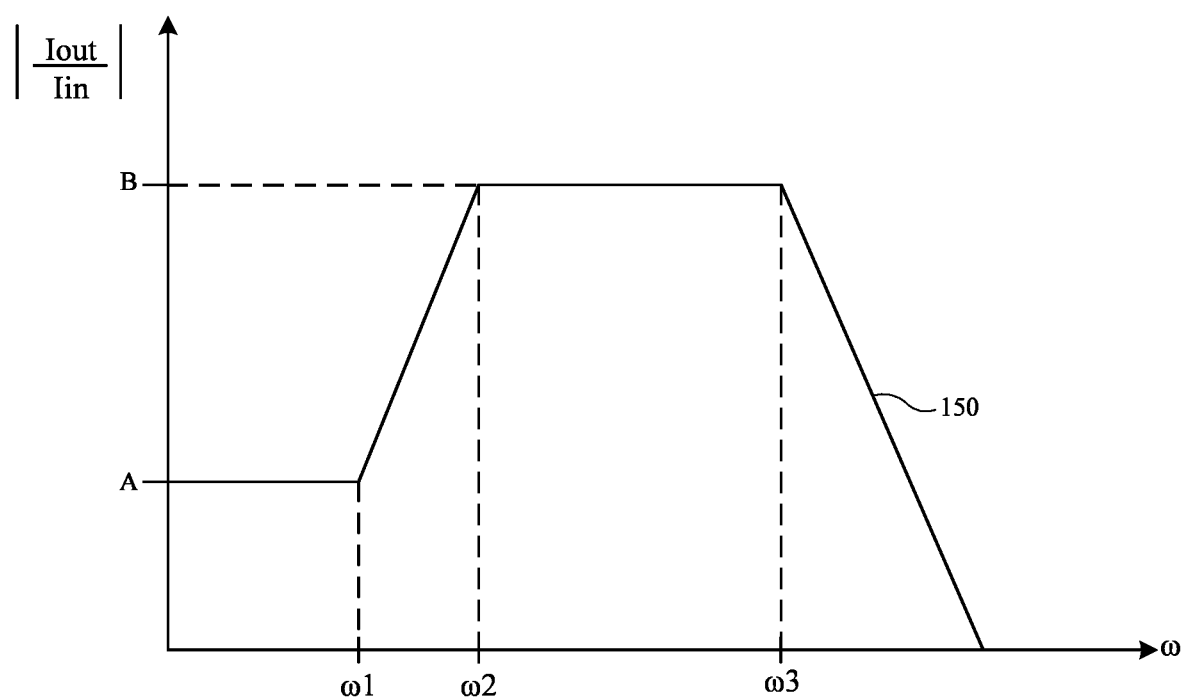
FIG. 9 is a diagram showing the frequency response of the frequency dependent current mirror shown in FIG. 8 in accordance with some embodiments.

The current flowing through transistor 128 down into the drain terminals of transistor 124 and 126 (sometimes referred to collectively as the tail node) is labeled input current Iin. The current flowing through transistor 130 is labeled as output current Iout. The input current Iin may be mirrored to the output current Iout by some predetermined mirroring factor. FIG. 9 is a diagram showing the current frequency response of current mirror 122 of FIG. 8. As shown in FIG. 9, line 150 plots the magnitude of the ratio of Iout to Iin as a function of frequency. Line 150 may be at a first magnitude A for frequencies less than ω1, ramp up from magnitude A to a second greater magnitude B from frequency ω1 to ω2, and then start ramping down for frequencies greater than ω3. Current mirror 122 having this type of frequency response with an elevated magnitude B for a given frequency range of interest (e.g., from ω2 to ω3) can help increase the gain of the IM2 signal generated by envelope detector 120 and is therefore sometimes referred to as a frequency-dependent current mirror. Configured and operated in this way, an amplified IM2 signal may be generated on path 131 to cancel unwanted IM2 terms on voltage line 82. Envelope detector 120 and frequency-dependent current mirror 122 may therefore sometimes be referred to collectively as a second order intermodulation (IM2) injection circuit, IM2 cancellation circuit, or 2nd order intermodulation distortion (IMD2) reduction circuit.

Figure 10:
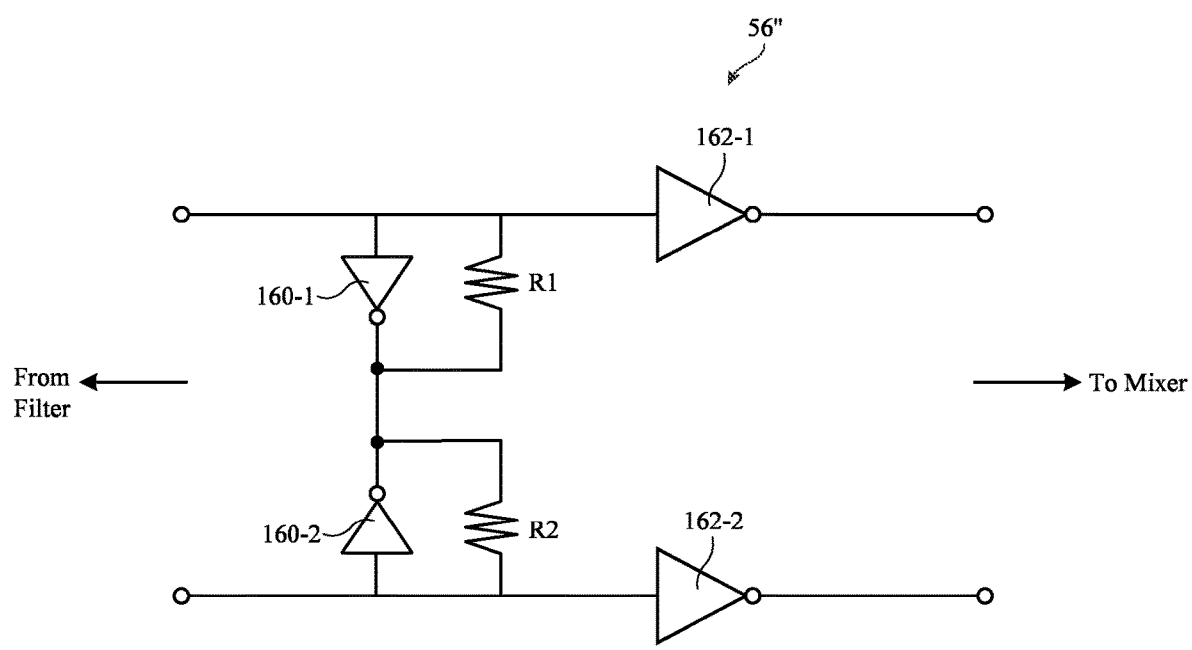
FIG. 10 is a circuit diagram of an illustrative current buffer having inverters and resistors configured to set the differential input resistance of the current buffer in accordance with some embodiments.

The embodiments of the current buffer shown in FIGS. 5 and 8 having current mirrors with complementary (n-type and p-type) diode-connected input transistors are merely illustrative. FIG. 10 is a circuit diagram of illustrative current buffer 56" that employs resistors to set the differential input resistance of the current buffer. As shown in FIG. 10, current buffer 56" may include inverters 160-1, 160-2, 162-1, and 162-2 and resistors R1 and R2. For example, each of these inverters may include a p-type transistor connected in series with an n-type transistor, where the gate terminals of the p-type and n-type transistors are shorted together. If desired, other types of inverters or inverting circuits may be used. Resistors R1 and R2 may be poly resistors (e.g., resistors formed from doped polysilicon or some other gate material), diffusion resistors (e.g., resistors formed from n-type or p-type diffusion regions in a semiconductor substrate), well resistors (e.g., resistors formed from n-wells or p-wells in a semiconductor substrate), metal resistors, transistors with high resistivity, or other types of resistive components.

Inverter 160-1 may have an input that is coupled to a first differential input port of current buffer 56" and an output. Inverter 162-1 may have an input coupled to the input of inverter 160-1 and an output that is coupled to a first differential output port of current buffer 56". Inverter 160-2 may have an input that is coupled to a second differential input port of current buffer 56" and an output. Inverter 162-2 may have an input coupled to the input of inverter 160-2 and an output that is coupled to a second differential output port of current buffer 56". The first and second differential input ports of current buffer 56" may be coupled to an LC filter (e.g., coupled to an output of filter 54 shown in FIG. 3). The first and second differential output ports of current buffer 56" may be coupled to a mixer (e.g., coupled to an input of one the mixers shown in FIG. 2).

Resistor R1 has a first terminal coupled to the input of inverter 160-1 and a second terminal coupled to the output of inverter 160-1. Resistor R2 has a first terminal coupled to the input of inverter 160-2 and a second terminal coupled to the output of inverter 160-2. Configured as such, resistors R1 and R2 set the differential input resistance of current buffer 56". The differential input resistance of the current buffer provided in this way can be sufficiently linear. Inverters 160-1 and 160-2 set the biasing point of these inverters and the common-mode resistance seen by the LC filter. Since the outputs of inverters 160-1 and 160-2 are shorted together, the noise of the two inverters 160-1 and 160-2 is common mode and would thus canceled out with each other. Inverters 160-1 and 160-2 may have the same size. Inverters 162-1 and 162-2 may also have identical sizes. Inverters 160-1 and 160-2 can be sized relatively small to minimize power consumption, whereas inverters 162-1 and 162-2 can be sized relatively large to provide greater current driveability for current buffer 56'' (e.g., inverters 162-1 and 162-2 can be larger than inverters 160-1 and 160-2).

Referring back to FIG. 2, any mismatch in the input resistance Rin of the current buffers 56 in I and Q channels can result in IQ mismatch (IQMM), which degrades the error vector magnitude (EVM) of wireless circuitry 24. To help alleviate the effect of the Rin mismatch or any other differences between the I and Q channels (broadly referred to as IQ mismatch), components within filters 54I and 54Q can be intentionally adjusted to different values to mitigate any undesired IQMM.

Figure 11A:
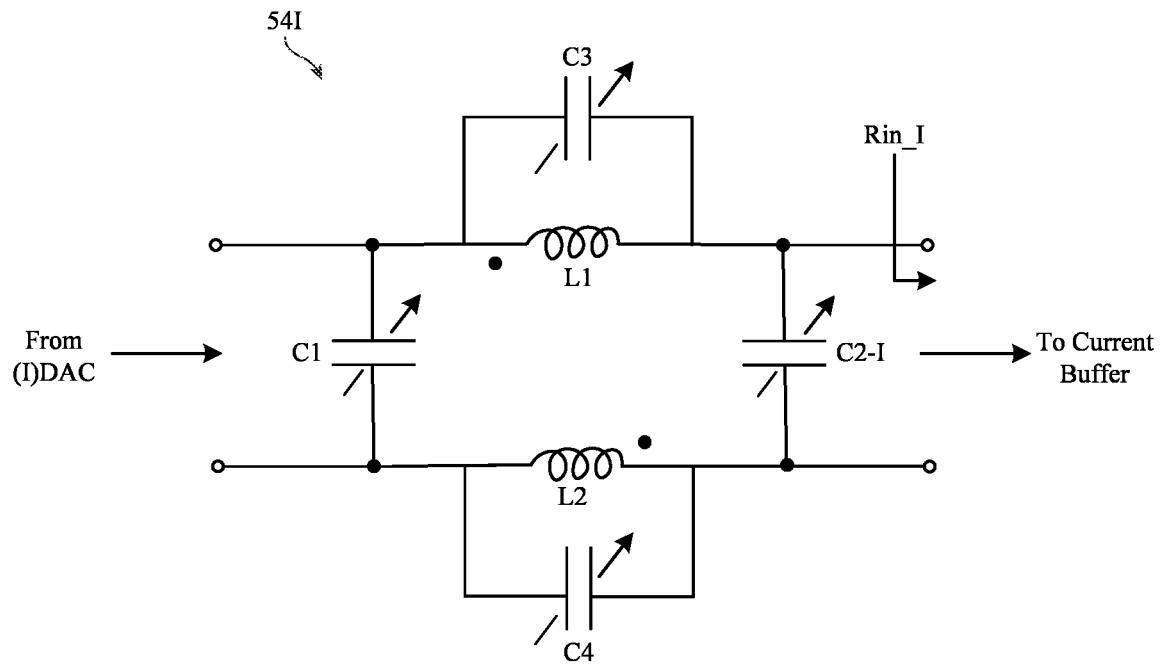
FIGS. 11A and 11B are circuit diagrams of illustrative LC filter circuits having different capacitor values for compensating a mismatch in input resistance the between I and Q channels of a wireless transmitter in accordance with some embodiments.

FIG. 11A is a circuit diagram of a differential LC filter 54I associated with the in-phase (I) channel. As shown in FIG. 11A, filter 54I may include inductors L1 and L2 and adjustable capacitors C1, C2-I, C3, and C4. Inductor L1 has a first (dotted) terminal coupled to a first differential input port of filter 54I and has a second terminal coupled to a first differential output port of filter 54I. Inductor L2 has a first terminal coupled to a second differential input port of filter 54I and has a second (dotted) terminal coupled to a second differential output port of filter 54I. Inductors L1 and L2 may have the same inductance value (as an example). Capacitor C3 may be coupled in parallel with inductor L1 within filter 54I. Capacitor C4 may be coupled in parallel with inductor L2 within filter 54I. Capacitor C1 may be coupled across the two differential input ports of filter 54I. Capacitor C2-I may be coupled across the two differential output ports of filter 54I. The differential output ports of filter 54I may see an I-channel input resistance Rini looking towards the corresponding current buffer.

Figure 11B:
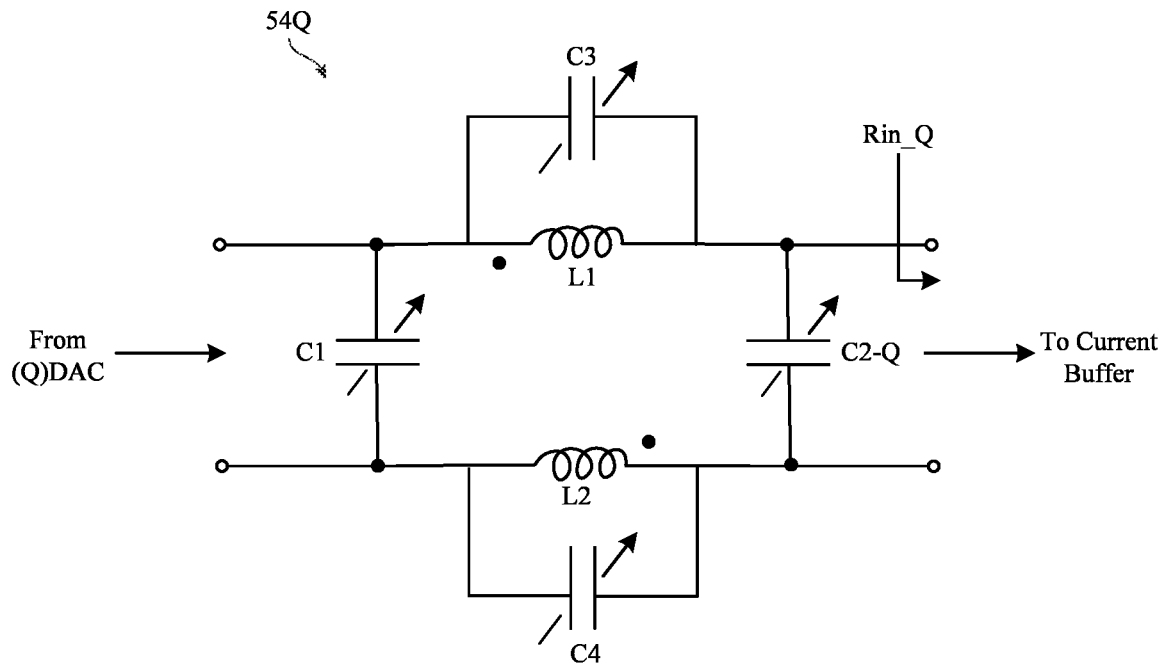

FIG. 11B is a circuit diagram of a differential LC filter 54Q associated with the quadrature-phase (Q) channel. As shown in FIG. 11B, filter 54Q may include inductors L1 and L2 and adjustable capacitors C1, C2-Q, C3, and C4. Inductor L1 has a first (dotted) terminal coupled to a first differential input port of filter 54Q and has a second terminal coupled to a first differential output port of filter 54Q. Inductor L2 has a first terminal coupled to a second differential input port of filter 54Q and has a second (dotted) terminal coupled to a second differential output port of filter 54Q. Capacitor C3 may be coupled in parallel with inductor L1 within filter 54Q. Capacitor C4 may be coupled in parallel with inductor L2 within filter 54Q. Capacitor C1 may be coupled across the two differential input ports of filter 54Q. Capacitor C2-Q may be coupled across the two differential output ports of filter 54Q. The differential output ports of filter 54Q may see a Q-channel input resistance Rin_Q looking towards the corresponding current buffer.

In accordance with an embodiment, capacitor C2-I in filter 54I and capacitor C2-Q in filter 54Q can be deliberately set (adjusted) to different capacitance values to reduce or mitigate the IQMM, which can improve the EVM of the overall wireless circuitry. The capacitance of C2-I and C2-Q could be different or could be the same. The IQMM may be a frequency dependent metric (e.g., a value that varies as a function of frequency). The difference in capacitance values of the filter output capacitors can be expressed as follows:

$$\Delta C_2(\%) = \frac{-\Delta R(\%)}{1 + \Delta R(\%)} \left( 1 - \frac{C_1}{C_2} * \frac{1}{\omega_0^2 L_{1,2} C_1 - 1} \right) \quad (1)$$

where $\Delta C_2$ represents the percentage capacitance difference between C2-I and C2-Q, where $\Delta R$ represents the percentage resistance difference between Rin_I and Rin_Q, and where $\omega_0$ represents a notch frequency in the frequency dependent IQMM(f).

Figure 12:
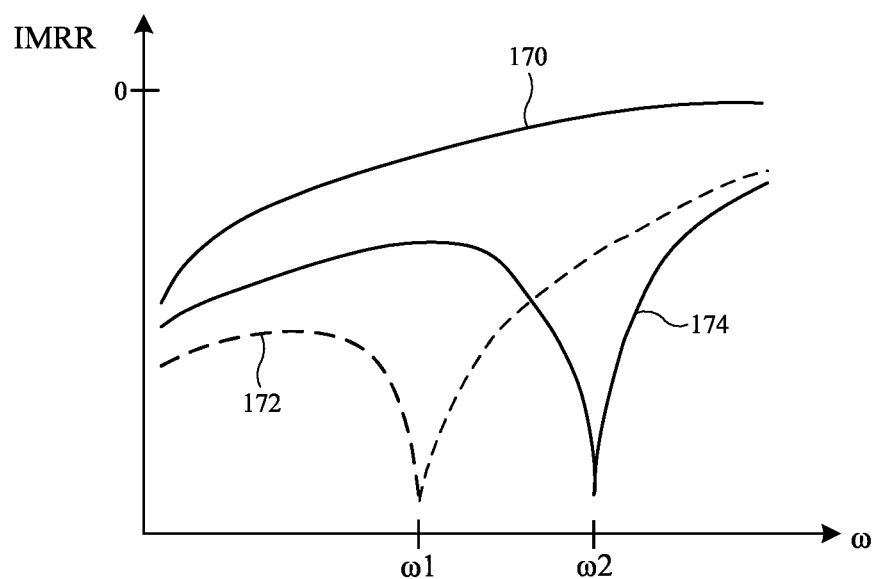
FIG. 12 is a diagram plotting the image rejection ratio (IMRR) as a function of frequency for an LC filter of the type shown in FIGS. 11A and 11B in accordance with some embodiments.

FIG. 12 is a diagram plotting the image rejection ratio (IMRR) as a function of frequency for an LC filter of the type shown in FIGS. 11A and 11B. Curve 170 may represent a first IMRR profile for an uncompensated filter scenario (e.g., $\Delta C2=0$), curve 172 may represent a second IMRR profile for a compensated filter scenario where $\Delta C2$ has a first non-zero value, and curve 174 may represent a third IMRR profile for another compensated filter scenario where $\Delta C2$ has a second non-zero value that is different than the first non-zero value. As shown in FIG. 12, curve 172 may have a notch at frequency $\omega 1$, whereas curve 174 has a notch at another frequency $\omega 2$. This shows how the value of $\Delta C2$ can be adjusted to shift the notch frequency in IQMM(f) across a given frequency band of interest (i.e., the notch frequency $\omega_0$ can be tailored to provide the best overall frequency dependent IQMM). If desired, the IMRR can be measured for different $\Delta C2$ values in the factory or in the field, and the desired capacitance difference $\Delta C2$ can be chosen to optimize the image rejection. The example of FIGS. 11 and 12 where different capacitance values within the LC filters are used to mitigate Rin mismatch between the I and Q channels is merely illustrative. In general, different C1 values, different C2 values, different C3 values, different C4 values, different L1 values, different L2 values, and/or some combination of these may be used to compensate for any undesirable mismatch between the I and Q channels.

The methods and operations described above in connection with FIGS. 1-12 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. Wireless circuitry comprising:
   a digital-to-analog converter;
   a filter coupled to an output of the digital-to-analog converter; and
   a current buffer coupled to the filter, the current buffer including
   a first n-type transistor having a source terminal coupled to a ground power supply line, a gate terminal, and a drain terminal coupled to the gate terminal of the first n-type transistor,
   a first p-type transistor having a source terminal coupled to a voltage line, a gate terminal, and a drain terminal coupled to the gate terminal of the first p-type transistor and coupled to the drain terminal of the first n-type transistor, a second n-type transistor having a source terminal coupled to the ground power supply line, a gate terminal shorted to the gate terminal of the first n-type transistor, and a drain terminal, and a second p-type transistor having a source terminal coupled to the voltage line, a gate terminal shorted to the gate terminal of the first p-type transistor, and a drain terminal coupled to the drain terminal of the second n-type transistor.

2. The wireless circuitry of claim 1, wherein the current buffer comprises a voltage regulator having an output coupled to the voltage line, the voltage regulator comprising:

a third n-type transistor having a source terminal coupled to the ground power supply line, a gate terminal, and a drain terminal coupled to the gate terminal of the third n-type transistor; and a third p-type transistor having a source terminal, a gate terminal, and a drain terminal coupled to the gate terminal of the third p-type transistor and coupled to the drain terminal of the third n-type transistor.

3. The wireless circuitry of claim 2, wherein the voltage regulator comprises:

a first temperature-dependent current source coupled to the source terminal of the third p-type transistor; and a second temperature-dependent current source coupled to the drain terminal of the third p-type transistor.

4. The wireless circuitry of claim 3, wherein the voltage regulator comprises:

an operational amplifier having a first input coupled to the source terminal of the third p-type transistor, a second input coupled to the voltage line, and an output; and a fourth p-type transistor having a drain terminal coupled to an additional voltage line, a gate terminal coupled to the output of the operational amplifier, and a source terminal coupled to the voltage line.

5. The wireless circuitry of claim 1, wherein the current buffer comprises a resistor having a first terminal coupled to the gate terminal of the first n-type transistor and having a second terminal coupled to the drain terminal of the first n-type transistor.

6. The wireless circuitry of claim 5, wherein the current buffer comprises a capacitor having a first terminal coupled to the first terminal of the resistor and having a second terminal coupled to the second terminal of the resistor.

7. The wireless circuitry of claim 6, wherein the current buffer comprises a current source having a first terminal coupled to the voltage line and having a second terminal coupled to the first terminal of the resistor.

8. The wireless circuitry of claim 1, wherein the current buffer comprises:

a third n-type transistor having a source terminal coupled to the ground power supply line, a gate terminal, and a drain terminal coupled to the gate terminal of the third n-type transistor;

a third p-type transistor having a source terminal coupled to the voltage line, a gate terminal, and a drain terminal coupled to the gate terminal of the third p-type transistor and coupled to the drain terminal of the third n-type transistor;

a fourth n-type transistor having a source terminal coupled to the ground power supply line, a gate terminal shorted to the gate terminal of the third n-type transistor, and a drain terminal; and a fourth p-type transistor having a source terminal coupled to the voltage line, a gate terminal shorted to the gate terminal of the third p-type transistor, and a drain terminal coupled to the drain terminal of the fourth n-type transistor.

9. The wireless circuitry of claim 8, further comprising:

a first mixer having an input coupled to drain terminal of the second n-type transistor; and a second mixer having an input coupled to the drain terminal of the fourth n-type transistor.

10. The wireless circuitry of claim 8, wherein the current buffer comprises an envelope detector having:

a fifth n-type transistor having a source terminal coupled to the ground power supply line, a gate terminal shorted to the gate terminal of the first n-type transistor, and a drain terminal; and a sixth n-type transistor having a source terminal coupled to the ground power supply line, a gate terminal shorted to the gate terminal of the third n-type transistor, and a drain terminal shorted to the drain terminal of the fifth n-type transistor.

11. The wireless circuitry of claim 10, wherein the current buffer comprises a frequency-dependent current mirror having:

a fifth p-type transistor having a drain terminal coupled to the drain terminal of the fifth n-type transistor, a gate terminal, and a source terminal coupled to an additional voltage line; and a sixth p-type transistor having a drain terminal coupled to the voltage line, a gate terminal shorted to the drain terminal of the fifth n-type transistor, and a source terminal coupled to the additional voltage line.

12. The wireless circuitry of claim 11, wherein the frequency-dependent current mirror comprises:

a resistor having a first terminal coupled to the gate terminal of the fifth p-type transistor and having a second terminal coupled to the drain terminal of the fifth p-type transistor; and a capacitor having a first terminal coupled to the gate terminal of the fifth p-type transistor and having a second terminal coupled to the additional voltage line.

13. The wireless circuitry of claim 1, wherein the current buffer comprises:

an circuit configured to sense an input voltage for the current buffer and to output a corresponding second order intermodulation signal; and a frequency-dependent current mirror configured to amplify the second order intermodulation signal and to output the amplified second order intermodulation signal onto the voltage line.

14. The wireless circuitry of claim 1, wherein the filter comprises:

a first inductor having a first terminal coupled to the digital-to-analog converter and having a second terminal coupled to the current buffer;

a second inductor having a first terminal coupled to the digital-to-analog converter and having a second terminal coupled to the current buffer;

a first capacitor having a first terminal coupled to the first terminal of the first inductor and having a second terminal coupled to the first terminal of the second inductor;

a second capacitor having a first terminal coupled to the second terminal of the first inductor and having a second terminal coupled to the second terminal of the second inductor;

a third capacitor coupled in parallel with the first inductor; and a fourth capacitor coupled in parallel with the second inductor.

15. The wireless circuitry of claim 14, wherein at least one of the first, second, third, and four capacitors has an adjustable capacitance.

16. Wireless circuitry comprising:

a digital-to-analog converter;

a filter coupled to an output of the digital-to-analog converter; and a current buffer coupled to the filter and to inputs of mixer circuitry, the current buffer including a first inverter having an input coupled to an output of the filter and having an output, a second inverter having an input coupled to the input of the first inverter and having an output coupled to one of the inputs of the mixer circuitry, and a first resistor having a first terminal coupled to the input of the first inverter and having a second terminal coupled to the output of the first inverter.

17. The wireless circuitry of claim 16, wherein the current buffer comprises:

a third inverter having an input coupled to the output of the filter and having an output;

a fourth inverter having an input coupled to the input of the third inverter and having an output coupled to another one of the inputs of the mixer circuitry; and a second resistor having a first terminal coupled to the input of the third inverter and having a second terminal coupled to the output of the third inverter.

18. The wireless circuitry of claim 17, wherein the first inverter and the third inverter have a same size, and wherein the second and fourth inverters have a same size and are larger than the first and third inverters.

19. Wireless circuitry comprising:

a first digital-to-analog converter configured to generate in-phase signals;

a second digital-to-analog converter configured to generate quadrature-phase signals;

a first LC filter configured to filter the in-phase signals and having first inductors and a first adjustable output capacitor with a first capacitance value;

a second LC filter configured to filter the quadrature-phase signals and having second inductors and a second adjustable output capacitor with a second capacitance value;

a first current buffer configured to receive signals from the first LC filter; and a second current buffer configured to receive signals from the second LC filter.

20. The wireless circuitry of claim 19, wherein the first and second capacitance values are tuned to optimize for a given image rejection ratio at a selected frequency.

* * * * *

UNITED STATES PATENT AND TRADEMARK OFFICE
CERTIFICATE OF CORRECTION

Page 1 of 1

PATENT NO. : 12,228,952 B2
APPLICATION NO. : 17/734642
DATED : February 18, 2025
INVENTOR(S) : Milad Darvishi and Georgios Palaskas It is certified that error appears in the above-identified patent and that said Letters Patent is hereby corrected as shown below:

In the Claims

Column 18, Line 9, Claim 9, "to drain terminal" should read -- to the drain terminal --

Column 18, Line 48, Claim 13, "an circuit" should read -- a circuit --

Column 19, Line 10, Claim 15, "four" should read -- fourth --

Signed and Sealed this
First Day of April, 2025

Coke Morgan Stewart
*Acting Director of the United States Patent and Trademark Office*